(12) United States Patent
Liu et al.

(10) Patent No.: US 12,287,241 B2
(45) Date of Patent: Apr. 29, 2025

(54) DEVICE AND METHOD FOR ONLINE MEASURING SPECTRUM FOR LASER DEVICE

(71) Applicant: Beijing RSLaser Opto-Electronics Technology Co., Ltd., Beijing (CN)

(72) Inventors: Guangyi Liu, Beijing (CN); Rui Jiang, Beijing (CN); Xiaoquan Han, Beijing (CN); Jiangshan Zhao, Beijing (CN); Pengfei Sha, Beijing (CN); Qingqing Yin, Beijing (CN); Hua Zhang, Beijing (CN); Xinyue Hu, Beijing (CN)

(73) Assignee: Beijing RSLaser Opto-Electroncis Technology Co., Ltd., Beijing (CN)

( * ) Notice: Subject to any disclaimer, the term of this patent is extended or adjusted under 35 U.S.C. 154(b) by 81 days.

(21) Appl. No.: 17/915,388

(22) PCT Filed: Dec. 16, 2020

(86) PCT No.: PCT/CN2020/136825
§ 371 (c)(1),
(2) Date: Sep. 28, 2022

(87) PCT Pub. No.: WO2021/196744
PCT Pub. Date: Oct. 7, 2021

(65) Prior Publication Data
US 2023/0194348 A1    Jun. 22, 2023

(30) Foreign Application Priority Data
Mar. 31, 2020 (CN) .......................... 202010244202.6

(51) Int. Cl.
*G01J 3/45* (2006.01)
*G01J 3/02* (2006.01)

(52) U.S. Cl.
CPC ................ *G01J 3/45* (2013.01); *G01J 3/021* (2013.01); *G01J 2003/451* (2013.01)

(58) Field of Classification Search
CPC ........ G01J 3/45; G01J 3/021; G01J 2003/451; G01J 1/4257; G01J 9/0246; G01J 3/26;
(Continued)

(56) References Cited

U.S. PATENT DOCUMENTS 7,554,667 B1    6/2009  Kampe
11,079,686 B2*  8/2021  Ishida ................. G03F 7/70575
(Continued)

FOREIGN PATENT DOCUMENTS

CN    101111738        1/2008
CN    101111738 A      1/2008
(Continued)

OTHER PUBLICATIONS

Office Action received in Japanese Patent Application No. 2022-560159, mailed on Sep. 26, 2023, 7 pages. (English Translation submitted).
(Continued)

*Primary Examiner* — Tarifur R Chowdhury
*Assistant Examiner* — Kemaya Nguyen
(74) *Attorney, Agent, or Firm* — Shook, Hardy & Bacon, L.L.P.

(57) ABSTRACT

Provided are a device (4) and a method for online measuring a spectrum for a laser device. The device (4) for online measuring a spectrum for a laser device includes: a first optical path assembly (G1) and a second optical path assembly (G2), and the second optical path assembly (G2) and the first optical path assembly (G1) constitute a measurement optical path. The second optical path assembly (G2) includes: an FP etalon (15) and a grating (18). The homogenized laser beam passes through the FP etalon (15) to
(Continued)

generate an interference fringe. The grating (18) is arranged after the FP etalon (15), or is arranged before the FP etalon (15) in the measurement optical path, and is configured to disperse the laser beam passing through the FP etalon (15).

8 Claims, 3 Drawing Sheets

(58) Field of Classification Search
CPC .......... G01J 2009/0257; G03F 7/70575; G03F 7/7085
See application file for complete search history.

(56) References Cited

U.S. PATENT DOCUMENTS

| | | | |
|---|---|---|---|
| 2004/0263844 | A1 | 12/2004 | Rafac |
| 2013/0215916 | A1* | 8/2013 | Kakizaki ............... H01S 3/2251 372/21 |

FOREIGN PATENT DOCUMENTS

| | | | | |
|---|---|---|---|---|
| CN | 103308168 | | 9/2013 | |
| CN | 104807545 | | 7/2015 | |
| CN | 106017685 | | 10/2016 | |
| CN | 108507686 | | 9/2018 | |
| CN | 108507686 | A * | 9/2018 | ............... G01J 9/00 |
| CN | 110098560 | A * | 8/2019 | |
| CN | 209214768 | | 8/2019 | |
| CN | 110411953 | | 11/2019 | |
| CN | 111006776 | A * | 4/2020 | |
| CN | 111289107 | | 6/2020 | |
| DE | 252678 | | 12/1987 | |
| JP | 06186086 | A * | 7/1994 | |
| JP | H06-186086 | A | 7/1994 | |
| JP | 2002-122481 | A | 4/2002 | |
| WO | 2019/111315 | A1 | 6/2019 | |

OTHER PUBLICATIONS

First Office Action Issued on Nov. 24, 2021 From The State Intellectual Property Office of People's Republic of China in Application No. 202010244202.6, Filed Mar. 31, 2020, 7 Pages (English Translation Provided Herewith).

English Translation of International Search Report Mailed Mar. 8, 2021 in International Application No. PCT/CN2020/136825 Filed Dec. 16, 2020.

International Preliminary Report on Patentability received for PCT Patent Application No. PCT/CN2020/136825, mailed on Oct. 13, 2022, 6 pages.

International Search Report and Written Opinion received for PCT Patent Application No. PCT/CN2020/136825, mailed on Mar. 8, 2021, 14 pages.

\* cited by examiner

DEVICE AND METHOD FOR ONLINE MEASURING SPECTRUM FOR LASER DEVICE

CROSS REFERENCE TO RELATED APPLICATION

This application is a Section 371 National Stage Application of International Application No. PCT/CN2020/136825, filed on Dec. 16, 2020, entitled "DEVICE AND METHOD FOR ONLINE MEASURING SPECTRUM FOR LASER DEVICE", which is incorporated herein by reference in its entirety which claims priority to Chinese Application No. 202010244202.6, filed on Mar. 31, 2020, incorporated herein by reference in their entirety.

TECHNICAL FIELD

The present disclosure relates to a field of spectrum measurement technology, and in particular, to a device and a method for measuring a spectrum for a laser device, and a laser device.

BACKGROUND

In the field of semiconductor chip processing, as a critical dimension of an IC chip is required to be smaller and smaller, a performance of a lithography machine is required to be higher and higher. In order to achieve a thinner line, a central wavelength of a light source used by the lithography machine is desired to become shorter, the light source is changed from a 365 nm mercury lamp to 248 nm and 193 nm light sources of an excimer laser device, and a 13.5 nm EUV light source. The excimer laser device is the most widely used light source in the field of semiconductor chip processing due to a large energy, a narrow FWHM (Full Width at Half Maxima), a short wavelength and a high efficiency. For example, a KrF excimer laser device and an ArF excimer laser device are commonly used, and their central wavelengths are 248 nm and 193 nm, respectively.

During an exposure process of the lithography machine, spectral parameters of an excimer laser such as a central wavelength, FWHM and E95 are required to keep stable, otherwise an exposure lines will become wider, resulting in a decrease in a yield rate of chips. For a 110 nm process node, a stability of a central wavelength for a laser device is required to be higher than 0.05 pm, while for a 28 nm process node, a stability of a central wavelength for a laser device is required to be higher than 0.03 pm. At the same time, due to a limitation of a dispersion calibration capability of a projection objective lens of a lithography machine, an exposure light source is required to have an extremely narrow FWHM. For the 110 nm process node, the FWHM of a laser device is generally required to be less than 0.35 pm, and that of E95 is required to be less than 0.75 pm. For the 28 nm process node, the FWHM of a laser device is required to be less than 0.2 pm, and that of E95 is required to be less than 0.4 pm. That is, a light source of an excimer laser device for lithography is required to have a high wavelength stability and an extremely narrow FWHM.

To this end, a detection module may set inside an excimer laser device to measure a central wavelength, FWHM and E95 for a laser device in real time online. On the one hand, spectral parameters of the laser device may be measured in real time, and on the other hand, important parameters are provided for a closed-loop feedback of the spectral parameters of the laser device.

SUMMARY

According to an aspect of the present disclosure, there is provided a device for measuring a spectrum for a laser device, including: a first optical path assembly and a second optical path assembly. The first optical path assembly is configured to homogenize a laser beam emitted by a laser device. The second optical path assembly constitutes a measurement optical path with the first optical path assembly, and is configured to perform a dispersion imaging of the laser beam homogenized by the first optical path assembly. The second optical path assembly includes: an FP (Fabry-Perot) etalon and a grating. The homogenized laser beam passes through the FP etalon to generate an interference fringe. The grating is arranged after the FP etalon, or is arranged before the FP etalon in the measurement optical path, and configured to disperse the laser beam passing through the FP etalon.

According to the embodiments of the present disclosure, the first optical path assembly includes: a first beam splitter, a second beam splitter and a light homogenizing assembly arranged in sequence along the measurement optical path. The first beam splitter is configured to reflect a portion of the laser beam emitted by the laser device to the second beam splitter. The second beam splitter is configured to enable the portion of the laser beam reflected by the first beam splitter to be incident on the light homogenizing assembly. The light homogenizing assembly is configured to homogenize the laser beam incident through the second beam splitter.

According to the embodiments of the present disclosure, the light homogenizing assembly includes: an optical light homogenizing element, a first convergent mirror and a first reflecting mirror arranged in sequence along the measurement optical path. The light homogenizing element is configured to homogenize the laser beam, so as to eliminate an influence of a spot unevenness and a direction instability of the laser beam on a measurement of a spectrum for a laser device. The first convergent mirror is configured to converge the laser beam homogenized by the light homogenizing element to the first reflecting mirror. The first reflecting mirror is configured to reflect the laser beam converged by the first convergent mirror to the second optical path assembly.

According to the embodiments of the present disclosure, the device for measuring a spectrum for a laser device further includes: an energy measurement assembly correspondingly arranged in an optical path to which another portion of the laser beam is reflected by the second beam splitter, and configured to measure an energy of the laser beam of the laser device in real time.

According to the embodiments of the present disclosure, the second optical path assembly includes: a diffusing sheet, a field diaphragm and a collimating mirror arranged in sequence along the measurement optical path. The diffusing sheet is configured to diffuse the laser beam homogenized by the first optical path assembly. The field diaphragm is configured to control an imaging range of the laser beam diffused by the diffusing sheet in a dispersion imaging process. The collimating mirror is arranged before the FP etalon in the measurement optical path, and is configured to ensure a collimation characteristic of the laser beam incident on the FP etalon.

According to the embodiments of the present disclosure, the second optical path assembly further includes: a second reflecting mirror, a second convergent mirror and an imaging apparatus arranged in sequence along the measurement optical path. The second reflecting mirror is arranged after the grating in the measurement optical path, and configured to reflect the laser beam dispersed by the grating to the second convergent mirror. The second convergent mirror is configured to converge the laser beam reflected by the second reflecting mirror to the imaging apparatus. The imaging apparatus is configured to image the laser beam passing through the second convergent mirror.

According to the embodiments of the present disclosure, the FP etalon includes: a first optical plane glass and a second optical plane glass. A first light facing surface of the first optical plane glass is not perpendicular to an incident direction of the laser beam incident on the FP etalon. A second light facing surface of the second optical plane glass is parallel with a first light backing surface of the first optical plane glass. A second light backing surface of the second optical plane glass is not perpendicular to an exit direction of the laser beam emitted from the FP etalon.

According to the embodiments of the present disclosure, a first high reflection film is coated on the first light backing surface of the first optical plane glass; and a second high reflection film is coated on the second light facing surface of the second optical plane glass.

According to the embodiments of the present disclosure, the grating is an echelle grating, and a blaze angle of the echelle grating is $\alpha$, and $\alpha \geq 70$ degrees.

According to another aspect of the present disclosure, there is provided a method for measuring a spectrum for a laser device, applied in the device for measuring a spectrum for a laser device, so as to measure spectral parameters of a laser beam generated by a laser device.

According to the embodiments of the present disclosure, the method for measuring a spectrum for a laser device includes:

obtaining a central wavelength $\lambda$ of a laser beam emitted by the laser to be:

$\lambda = \lambda_f + k \cdot FSR$ and $|\lambda - \lambda_g| \leq FSR/2$.

wherein $\lambda_g$ is a first central wavelength of the laser beam obtained based on a grating of the device for measuring a spectrum for a laser device, and $\lambda_f$ is a second central wavelength of the laser beam obtained based on an FP etalon of the device for measuring a spectrum for a laser device, k is an integer, FSR is a free spectral range of the FP etalon;

obtaining, based on the central wavelength $\lambda$ of the laser beam and a radius r and a width $d_r$ of an interference fringe obtained by the FP etalon, a spectral width $\Delta \lambda$ of the laser beam to be:

$$\Delta \lambda = \frac{\lambda \cdot r}{f^2} d_r$$

wherein f is a focal length of a second convergent mirror of the device for measuring a spectrum for a laser device; and obtaining a spectral FWHM (Full Width at Half Maxima) and E95 of the spectral parameters according to the spectral width $\Delta \lambda$ of the laser beam.

According to the embodiments of the present disclosure, the obtaining a spectral FWHM and E95 of the spectral parameters according to the spectral width $\Delta \lambda$ of the laser beam includes:

$FWHM = [\Delta \lambda_1 \Delta \lambda_2 \ldots \Delta \lambda_p 1] \cdot [h_1 h_2 \ldots h_p h_{p+1}]^T$ $E95 = [\Delta \lambda_1 \Delta \lambda_2 \ldots \Delta \lambda_p 1] \cdot [e_1 e_2 \ldots e_p e_{p+1}]^T$ wherein $d_{r1}$, $d_{r2}$, $d_{r3}$, $d_{r4}$, ... $d_{rp}$ are width values of different interference fringes at different heights for the FP etalon; $\Delta \lambda_1$, $\Delta \lambda_2$, $\Delta \lambda_3$, $\Delta \lambda_4$, ... $\Delta \lambda_p$ are different spectral widths of the spectrum for the laser device corresponding to the $d_{r1}$, $d_{r2}$, $d_{r3}$, $d_{r4}$, ... $d_{rp}$; $H = [h_1 h_2 \ldots h_p h_{p+1}]^T$ is a coefficient of the FWHM of the laser beam; and $E = [e_1 e_2 \ldots e_p e_{p+1}]^T$ is a coefficient of E95 of the laser beam.

According to another aspect of the present disclosure, there is provided a laser device, including: the above device for measuring a spectrum for a laser device, a discharge device, a power supply device, and a line width narrowing device. The discharge device is configured to generate a laser beam incident on the device for measuring a spectrum for a laser device. The power supply device is configured to pump the discharge device so that the discharge device generates a laser beam. The line width narrowing device is configured to generate a laser beam having an extremely narrow line width, and adjust a central wavelength and an output stability of the laser beam. The device for measuring a spectrum for a laser device is configured to monitor spectral parameters of the laser beam in real time and give a feedback to the line width narrowing device.

DETAILED DESCRIPTION OF EMBODIMENTS

Figure 1:
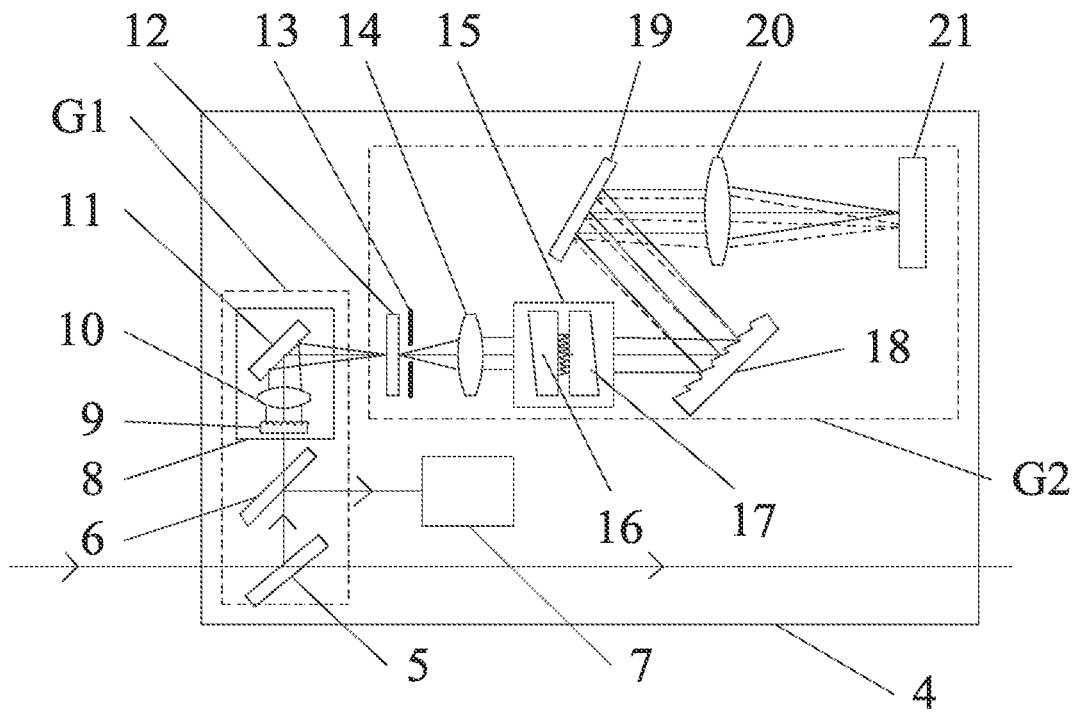
FIG. 1 is a schematic diagram of a structure constitution of a device for measuring a spectrum for a laser device according to the embodiments of the present disclosure.

In order to make the objectives, technical solutions and advantages of the present disclosure clearer, the present disclosure will be further described in detail below with reference to the specific embodiments and the accompanying drawings.

A method for measuring a central wavelength and a FWHM for a laser device is a measurement method based on a Fabry-Perot etalon (hereinafter referred to as an FP etalon). As the FP etalon has small size and high spectral resolution, the method based on the FP etalon is a common method for measuring a central wavelength, a FWHM and E95 for an excimer laser device with a high precision. However, in order to achieve a measurement precision of a sub-picometer-level (0.2-0.35 pm) FWHM and a high precision central wavelength (0.01-0.1 pm), a free spectral range of the FP etalon is generally required to be in the teen to dozens of picometers. As a result, an entire wavelength adjustment range (about 400 pm) of the excimer laser device may not be covered.

In the related art, a central wavelength, a FWHM and E95 may be measured by a combination of an FP etalon and a grating, a laser beam of a laser device is divided into two beams by a beam splitter. One beam is irradiated on the grating through a collimating optical path, dispersed by the grating, and is then irradiated on a CCD camera through a convergent plane glass for a coarse measurement for the central wavelength. The other beam is irradiated on an FP etalon after passing through a light homogenizing path and is incident on a CCD camera after being interfered by the FP etalon for a fine measurement of the central wavelength and a measurement for the FWHM and E95. Through the above design of the optical path structure, an interference fringe of the grating and an interference fringe of the FP etalon may be irradiated on the same CCD. However, it is still necessary to split and combine a beam, which leads to a complex optical path structure, and is difficult for assembly and adjustment. At the same time, in terms of the algorithm, position information of the interference fringe of the grating and the interference fringe of the FP etalon need to be further calculated separately, and then the central wavelength of the laser beam may be calculated. The calculation method is complicated.

In addition, there is also a manner for measuring a central wavelength, a FWHM and E95 for a laser device by using two FP etalons. One of the FP etalons has a relatively large free spectral range (400 pm) and is used for a coarse measurement for the central wavelength. The other FP etalon has a relatively small free spectral range (10 pm), and is used for a fine measurement for the central wavelength and a measurement of the FWHM and E95. For this purpose, a beam splitter is used to divide a laser beam generated by a laser device into two beams, and then two light homogenizing assemblies and two CCDs are added. This directly causes a large volume and a high cost for the measurement device. In addition, it is necessary to calculate the central wavelengths of the two FP etalons at the same time to obtain a precise value of the central wavelength. The calculation amount is too large. Moreover, the data of the two FP etalons must be synchronized, which has a high requirement on an acquisition circuit.

Finally, in the prior art, there is also a manner by connecting an FP etalon and a grating in series. A beam first passes through the FP etalon, and then the beam is selected through a slit. The beam passing through the slit is irradiated on the grating after passing through a collimating optical path, is diffracted by the grating, and is then irradiated on a PMT (photomultiplier tube) through another slit. At this time, when the central wavelength of the excimer laser device changes, a light intensity of the PMT will drop rapidly, thereby achieving a high precision measurement for the center wavelength. However, when the central wavelength of the laser device changes, it is necessary to change the positions of the two slits, or to rotate an angle of the grating and adjust a distance of the FP etalon, or to change a nitrogen pressure cavity between the FP etalons. This requires a displacement stage or a pressure control structure having an extremely high precision, a gas control structure having a high precision, and a synchronous control system. The structure is too complicated, the cost is too high, and the operation stability is obviously poor.

In order to solve the technical problems of a device for measuring a spectrum for a laser device in the prior art, such as too complex optical path structure, too large volume, too high cost, too large amount of calculation and too poor operation stability, according to the present disclosure, there is provided a device and a method for measuring a spectrum for a laser device, and a laser device.

According to an aspect of the present disclosure, there is provided a device 4 for measuring a spectrum for a laser device. As shown in FIG. 1, the device includes: a first optical path assembly G1 and a second optical path assembly G2. The first optical path assembly G1 is configured to homogenize a laser beam emitted by a laser device. The second optical path assembly G2 is configured to perform a dispersion imaging on the laser beam homogenized by the first optical path assembly.

The second optical path assembly G2 and the first optical path assembly G1 constitute a measurement optical path of the device 4 for measuring a spectrum for a laser device. The second optical path assembly G2 is arranged after the first optical path assembly G1 along the measurement optical path.

As shown in FIG. 1, the second optical path assembly G2 includes: an FP etalon 15 and a grating 18. The homogenized laser beam passes through the FP etalon 15 to generate an interference fringe. The grating 18 is arranged after the FP etalon 15 in the measurement optical path, i.e., an optical design that the FP etalon 15 and the grating 18 are "connected in series" is used. The grating 18 is arranged corresponding to the FP etalon 15 and configured to disperse the laser beam passing through the FP etalon 15.

According to the embodiments of the present disclosure, the grating 18 is arranged after the FP etalon 15, or is arranged before the FP etalon 15 in the measurement optical path. Those skilled in the art should understand that for the device 4 for measuring a spectrum for a laser device of the present disclosure, when the grating 18 is arranged before the FP etalon 15, the laser beam may be dispersed, so that the laser beam is incident on the FP etalon 15. The laser beam obtained based on such setting and the laser beam obtained based on the setting that the grating 18 is arranged after the FP etalon 15 in the measurement optical path may both be used to achieve an online measurement for a spectrum for a laser device according to the embodiments of the present disclosure.

According to the embodiments of the present disclosure, specifically, the grating 18 may be an echelle grating. Laser beams with different wavelengths have inconsistent dispersion angles when passing through the grating 18, so as to achieve a large angle dispersion to the laser beam. A blaze angle of the echelle grating is $\alpha$, and $+\geq 70$ degrees, so as to achieve a great dispersion effect.

In addition, the grating may also arranged before the FP etalon in the measurement optical path, so that the laser beam homogenized by the first optical path assembly G1 is first dispersed on the grating, and is then incident on the FP etalon to generate an interference fringe. The dispersion-interference process is not significantly different from the interference-dispersion process in the above embodiment in measuring a spectral parameter by the device 4 for measuring a spectrum for a laser device. Specifically, in the embodiments of the present disclosure, the above setting that the grating is arranged after the FP etalon in the measurement optical path is taken as an example to describe the device 4 for measuring a spectrum for a laser device in detail. Those skilled in the art should understand that it does not limit the protection scope of the claims.

Therefore, through the optical design that the FP etalon 15 and the grating 18 are "connected in series" in the present disclosure, interference fringes containing all spectral information necessary for the measurement may be obtained without splitting and combining a laser beam, and the measurement algorithm for a spectral parameter is simple. This achieves a high precision measurement for a central wavelength of a laser beam in a wide range, and an accurate measurement for a corresponding FWHM and spectral parameters of E95. There is no moving element in the measurement optical path, the structure is simple and compact, the measurement precision is high, and the stability is high. The corresponding measurement algorithm is simple and efficient, and has an extremely high scientific research or commercial application value.

According to the embodiments of the present disclosure, as shown in FIG. 1, the first optical path assembly G1 includes: a first beam splitter 5, a second beam splitter 6 and a light homogenizing assembly 8 arranged in sequence along the measurement optical path. The first beam splitter 5 is configured to reflect a portion of the laser beam emitted by the laser device to the second beam splitter 6. In the laser beams emitted from the laser device, another portion of the laser beam accounting for a large proportion may penetrate the first beam splitter 5 and be directly emitted outside the device 4 for measuring a spectrum for a laser device. The second beam splitter 6 is configured to enable the portion of the laser beam reflected by the first beam splitter 5 to be incident on the light homogenizing assembly 8. The light homogenizing assembly 8 is configured to homogenize the laser beam incident through the second beam splitter 6. The first beam splitter 5 and the second beam splitter 6 may be flat glass, and a material thereof may be $CaF_2$ or an excimer grade fused silica. In addition, a coating may not be provided on outer surfaces of the first beam splitter 5 and the second beam splitter 6 to ensure a longer service life of the two.

According to the embodiments of the present disclosure, as shown in FIG. 1, the device 4 for measuring a spectrum for a laser device further includes: an energy measurement assembly 7 correspondingly arranged in an optical path to which another portion of the laser beam is reflected by the second beam splitter 6, and configured to measure an energy of the laser beam emitted by the laser device in real time. Specifically, a portion of the laser beam accounting for a large proportion reflected by the first beam splitter 5 is transmitted by the second beam splitter 6 and is then incident on the light homogenizing assembly 8. The other portion of the laser beam accounting for a small proportion is reflected by the second beam splitter 6 to another optical path. The another optical path is used for measuring the energy of the laser beam. The energy measurement assembly 7 is arranged corresponding to the another optical path, and may specifically be a structural assembly constituted by an energy detector or a photodiode, so as to receive the laser beam reflected by the second beam splitter 6 for measuring an energy of this laser beam in real time when the laser device emits a laser beam.

According to the embodiments of the present disclosure, as shown in FIG. 1, the light homogenizing assembly 8 includes: an optical light homogenizing element 9, a first convergent lens 10 and a first reflecting mirror 11 arranged in sequence along the measurement optical path. The light homogenizing element 9 may be a microlens array or an integrator rod, and configured to homogenize the laser beam incident through the second beam splitting beam 6, so as to eliminate an influence of a spot unevenness and a direction instability of the laser beam on a measurement of a spectrum for a laser device. The first convergent lens 10 is configured to converge the laser beam homogenized by the light homogenizing element 9 to the first reflecting mirror 11. A light facing surface of the first reflecting mirror 11 may be coated with a high reflection film, which is configured to reflect the laser beam converged by the first convergent lens 10 to the second optical path assembly G2. The first reflecting mirror 11 changes the structure design of the measurement optical path, so that the structure is more compact. This is beneficial to miniaturization of the volume of the device for measuring a spectrum for a laser device.

According to the embodiments of the present disclosure, as shown in FIG. 1, the second optical path assembly G2 includes: a diffusing sheet 12, a field diaphragm 13 and a collimating lens 14 arranged in sequence along the measurement optical path. The diffusing sheet 12 is configured to diffuse the laser beam passing through the first optical path assembly G1 and homogenized by the light homogenizing assembly 8. Specifically, the laser beam is reflected by the first reflecting mirror 11 and incident on a light facing surface of the diffusing sheet 12. The field diaphragm 13 is configured to control an imaging range of the laser beam diffused by the diffusing sheet 12 in a dispersion imaging process. The laser beam finally passes through the measurement optical path, is irradiated on an imaging apparatus, and is captured by the imaging apparatus to form an interference image. The field diaphragm 13 is configured to control an imaging range thereof on the imaging apparatus. The collimating lens 14 is arranged before the FP etalon 15 in the measurement optical path, and is configured to ensure a collimation characteristic of the laser beam incident on the FP etalon 15.

According to the embodiments of the present disclosure, as shown in FIG. 1, the second optical path assembly G2 further includes: a second reflecting mirror 19, a second convergent lens 20 and an imaging apparatus 21 arranged in sequence along the measurement optical path. The second reflecting mirror 19 is arranged after the grating 18 in the measurement optical path, and configured to reflect the laser beam dispersed by the grating 18 to the second convergent lens 20. The second convergent lens 20 is configured to converge the laser beam reflected by the second reflecting mirror 19 to the imaging apparatus 21. The imaging apparatus 21 may be a CCD camera having a function of capturing or receiving a laser beam, and the CCD camera is configured to achieve an interference-dispersion imaging of the laser beam. The imaging apparatus 21 is configured to image the laser beam passing through the second convergent lens 20. The second reflecting mirror 19 further changes the structure design of the measurement optical path, so that the structure is further more compact. This is beneficial to further miniaturization of the volume of the device for measuring a spectrum for a laser device.

According to the embodiments of the present disclosure, the FP etalon 15 includes: a first optical plane glass 16 and a second optical plane glass 17. The first optical plane glass 16 and the second optical plane glass 17 may be plane glasses having the same shape and structure, and having heights arranged in parallel to each other. Specifically, the first optical plane glass 16 and the second optical plane glass 17 may be specifically of a flat plate structure with a right-angled trapezoid cross section, and each plane glass includes a light facing surface and a light emitting surface. A first light facing surface of the first optical plane glass 16 is not perpendicular to an incident direction of the laser beam incident on the FP etalon 15. A second light facing surface of the second optical plane glass 17 is parallel with a first light backing surface of the first optical plane glass 16. A second light backing surface of the second optical plane glass 17 is not perpendicular to an exit direction of the laser beam emitted from the FP etalon 15. In other words, the first light facing surface of the first optical plane glass 16 and the second light emitting surface of the second optical plane glass 17 may be parallel to each other. Specifically, the laser beam collimated by the collimating lens 14 enters the FP etalon, and is incident on the first light facing surface of the first optical plane glass 16. The incident direction thereof is the incident direction of the collimating lens 14. The laser beam enters the first optical plane glass 16, exits through the first light emitting surface of the first optical plane glass 16, enters a gap between the first light emitting surface of the first optical plane glass 16 and the second light facing surface of the second optical plane glass 17, is repeatedly reflected multiple times by the first light emitting surface of the first optical plane glass 16 and the second light facing surface of the second optical plane glass 17 in the gap, finally passes through the second optical plane glass 17, and exits from the second light emitting surface of the second optical plane glass 17, i.e., it exits from the FP etalon 15 to the grating 18. The exit direction of the laser beam is an incident direction to the grating 18.

According to the embodiments of the present disclosure, a first high reflection film is coated on the first light backing surface of the first optical plane glass 16; and a second high reflection film is coated on the second light facing surface of the second optical plane glass 17. The FP etalon 15 is a high precision optical element, and a coating reflection coefficient of the high reflection film coated on it generally needs to be greater than 95%, so that when being incident on the FP etalon 15, the light beam will be reflected multiple times by the two high reflection films to generate a multi-beam interference.

The setting that the FP etalon and the grating are "connected in series" according to the present disclosure achieves a high precision measurement for a central wavelength of a laser beam in a wide range, and an accurate measurement for a corresponding FWHM and E95 of spectral parameters. There is no moving element in the measurement optical path, the structure is simple and compact, the measurement precision is high, and the stability is high. The corresponding measurement algorithm is simple and efficient, and has an extremely high scientific research or commercial application value.

According to another aspect of the present disclosure, there is provided a method for measuring a spectrum for a laser device, applied in the above device for measuring a spectrum for a laser device, so as to measure spectral parameters of a laser beam generated by a laser device.

Figure 3:
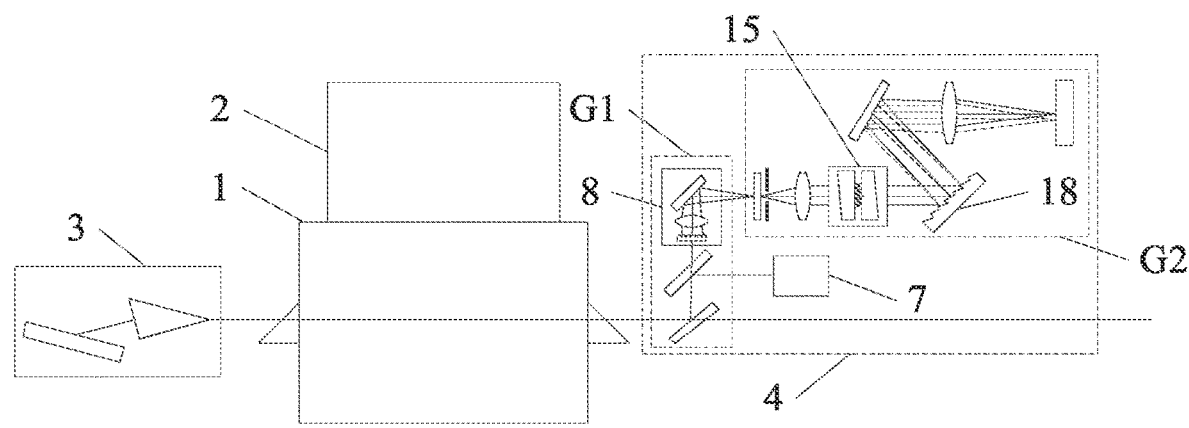
FIG. 3 is a schematic diagram of a structure constitution of a laser device according to the embodiments of the present disclosure.

Specifically, the spectral parameters may include parameters such as an energy, a central wavelength, a FWHM, and E95 of the laser beam. The spectral parameters of the laser beam emitted by the discharge device 1 and measured by the above device 4 for measuring a spectrum for a laser device shown in FIG. 1 or FIG. 3 are taken as an example to further describe the calculation method for measuring a spectrum for a laser device.

Figure 2:
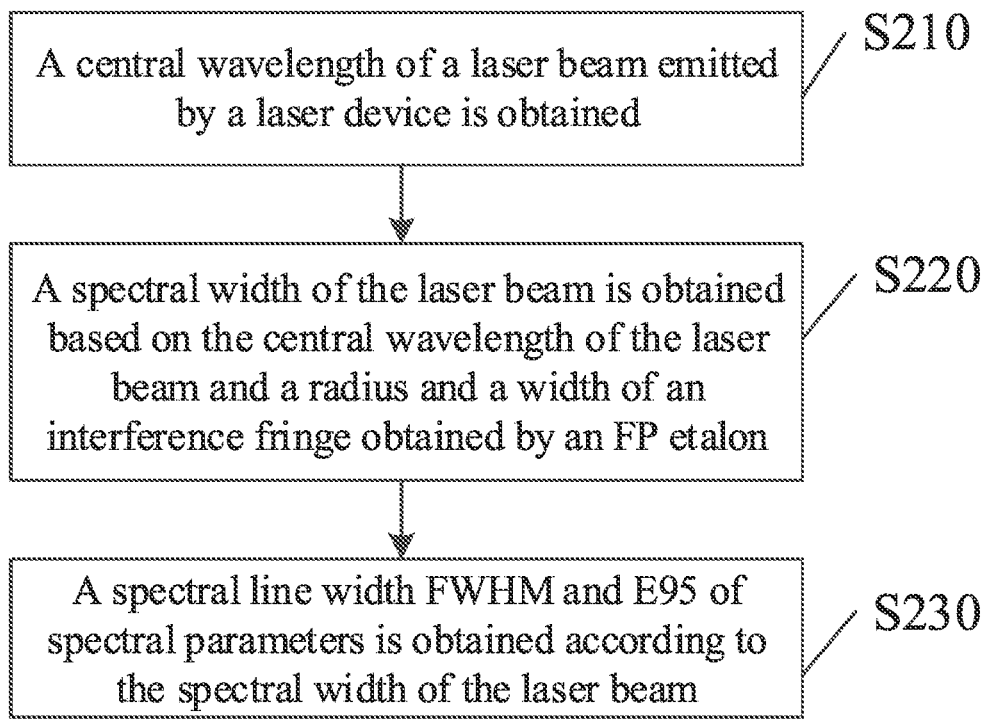
FIG. 2 is a schematic flowchart of a method for measuring a spectrum for a laser device according to the embodiments of the present disclosure.

According to the embodiments of the present disclosure, as shown in FIG. 2, the method for measuring a spectrum for a laser device may include steps S210-S230.

In step S210, a central wavelength of a laser beam emitted by the laser is obtained.

First, for the FP etalon 15, an incident beam satisfies equation (1) as follows:

$$\lambda_f = \frac{2nd}{m}\cos\theta$$

wherein $\lambda_f$ is a second central wavelength of a laser device, n is a refractive index of gas in an FP etalon 15, d is a distance between a first optical plane glass 16 and a second optical plane glass 17 of the FP etalon 15, m is a level of an interference fringe of the FP etalon 15 obtained on an imaging apparatus 21, and θ is an exit angle of the laser beam of the FP etalon 15, then the second central wavelength of the laser beam corresponding to the FP etalon 15 satisfies equation (2):

$$\lambda_f = \frac{2nd}{m}\left(1 - \frac{r^2}{2f^2}\right)$$

wherein r is a radius of the interference fringe corresponding to the FP etalon 15 obtained on the imaging device 21, and f is a focal length of a second convergent lens 20.

In addition, a first central wavelength of the laser beam incident on a grating 18 satisfies a grating equation (3):

$$\lambda_g = \frac{d_g(\sin\theta_g + \sin\beta_g)}{m_g}$$

wherein $d_g$ is a grating constant, $m_g$ is the grating level, $\theta_g$ is an incident angle of the laser beam incident on the grating 18, and $\beta_g$ is an exit angle of the laser beam from the grating 18. It can be seen that a change of the wavelength $\lambda_g$ is proportional to the exit angle $\beta_g$, i.e., satisfy equation (4):

$$d\lambda_g = k_g \cdot d\beta_g$$

wherein $k_g$ is an angular dispersion coefficient of the grating.

Figure 4:
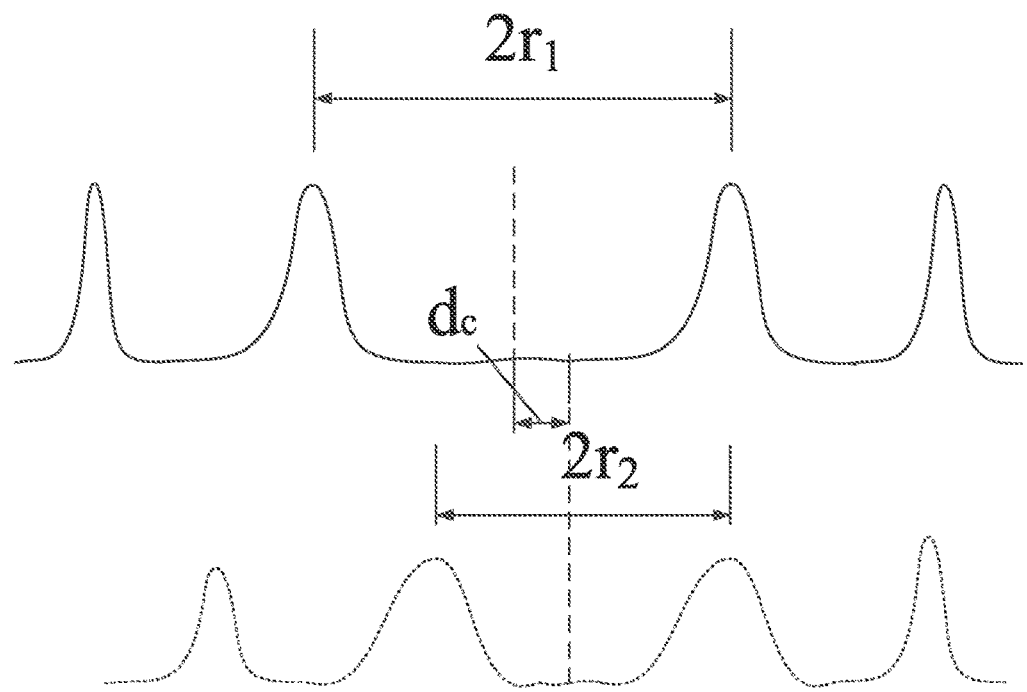
FIG. 4 is a schematic diagram of a distribution of a central wavelength of a laser beam and a corresponding interference fringe thereof according to the embodiments of the present disclosure.

In other words, the interference fringe generated by an interference of the FP etalon 15 will be shifted by $d\beta_g$ due to a diffraction effect of the grating 18. As shown in FIG. 4, when a central offset of the interference fringe is $d_c$, the above equation (3) may also be converted into equation (5) as follows:

$$\lambda_g = k_g \cdot \frac{d_c}{f} + \lambda_0$$

wherein $$\frac{d_c}{f}$$

is a linear dispersion coefficient of the grating; the first central wavelength $\lambda_g$ is a coarse measurement result of the central wavelength of the laser beam passing through the grating 18. According to the second central wavelength $\lambda_f$ the laser beam measured by the FP etalon 15 (i.e. the equation (2)), when a free spectral range of the FP etalon 15 is set to be as FSR, an actual central wavelength of the laser beam satisfies equation (6) as follows:

$$\lambda = \lambda_f + k \cdot FSR, \text{ and } |\lambda - \lambda_g| \leq FSR/2$$

wherein k is an integer, and λ in the equation (6) is a precise value of the central wavelength of the above laser beam to be measured. According to this, a central wavelength of the laser beam may be monitored in real time, and λ in the above equation (6) may also be fed back to a line width narrowing device 3 of the laser device shown in FIG. 3 to achieve a closed-loop feedback to the central wavelength of the laser beam.

In step S220, a spectral width Δλ of the laser beam is obtained based on the radius and the width of the interference fringe obtained by the FP etalon.

In addition, the FWHM and E95 of the laser beam to be measured are functions of the width $d_r$ of the interference fringe of the FP etalon. The relationship between the spectral width Δλ of the spectrum for the laser device and the width $d_r$ of the interference fringe satisfies equation (7):

$$\Delta\lambda = \frac{\lambda \cdot r}{f^2} d_r$$

In step S230, the spectral FWHM and E95 of the spectral parameters are obtained according to the spectral width of the laser beam.

Figure 5:
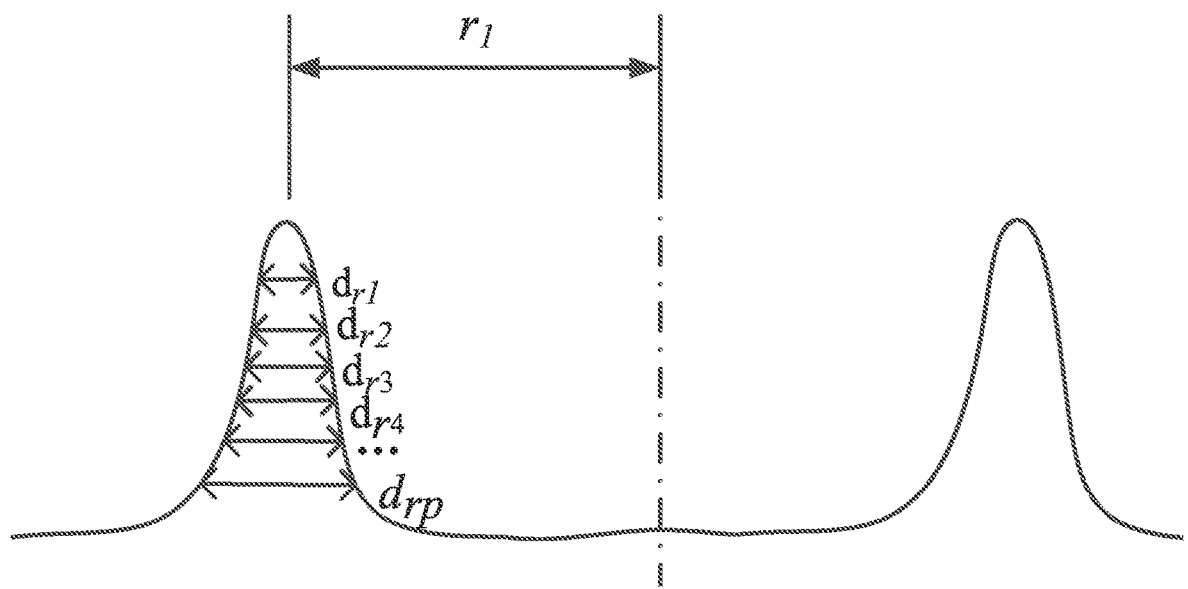
FIG. 5 is a calculation principle diagram of a FWHM and E95 of a laser beam according to the embodiments of the present disclosure.

In order to precisely measure the FWHM and E95 of the laser device, and at the same time avoid an integral operation, width values $d_{r1}$, $d_{r2}$, $d_{r3}$, $d_{r4}$, ... $d_{rp}$ of different interference fringes of the FP etalon at different heights are taken, and are brought into the above equation (7), so that different spectral widths $\Delta\lambda_1$, $\Delta\lambda_2$, $\Delta\lambda_3$, $\Delta\lambda_4$, ... $\Delta\lambda_p$ of the spectrum for the laser device are obtained by calculation. As shown in FIG. 5, at this time, the FWHM and E95 of the laser beam may be expressed to be equations (8) and (9) as follows:

$$\text{FWHM} = [\Delta\lambda_1 \Delta\lambda_2 \ldots \Delta\lambda_p 1] \cdot [h_1 h_2 \ldots h_p h_{p+1}]^T$$

$$E95 = [\Delta\lambda_1 \Delta\lambda_2 \ldots \Delta\lambda_p 1] \cdot [e_1 e_2 \ldots e_p e_{p+1}]^T$$

wherein $H = [h_1\ h_2\ \ldots\ h_p\ h_{p+1}]^T$ is a coefficient of the FWHM of the laser beam; and $E = [e_1\ e_2\ \ldots\ e_p\ e_{p+1}]^T$ is a coefficient of E95 of the laser beam.

Regarding the coefficient H of the FWHM and the coefficient E of E95 of the corresponding laser beam in the above equation (8) and equation (9), true values (i≥p+1) of the FWHM and E95 of i groups are measured, the FWHM and E95 of i groups and corresponding spectral width values at different heights $\Delta\lambda_1$, $\Delta\lambda_2$, $\Delta\lambda_3$, $\Delta\lambda_4$, ... $\Delta\lambda_p$ are obtained, and equations (10) and (11) are established as follows:

$$\begin{bmatrix} FWHM_1 \\ FWHM_2 \\ \vdots \\ FWHM_i \end{bmatrix} = \begin{bmatrix} \Delta\lambda_{11} & \Delta\lambda_{21} & \cdots & \Delta\lambda_{p1} & 1 \\ \Delta\lambda_{12} & \Delta\lambda_{22} & \cdots & \Delta\lambda_{p2} & 1 \\ & & \vdots & & \\ \Delta\lambda_{1i} & \Delta\lambda_{2i} & \cdots & \Delta\lambda_{pi} & 1 \end{bmatrix} \cdot H$$

$$\begin{bmatrix} E95_1 \\ E95_2 \\ \vdots \\ E95_i \end{bmatrix} = \begin{bmatrix} \Delta\lambda_{11} & \Delta\lambda_{21} & \cdots & \Delta\lambda_{p1} & 1 \\ \Delta\lambda_{12} & \Delta\lambda_{22} & \cdots & \Delta\lambda_{p2} & 1 \\ & & \vdots & & \\ \Delta\lambda_{1i} & \Delta\lambda_{2i} & \cdots & \Delta\lambda_{pi} & 1 \end{bmatrix} \cdot E$$

Based on the above equation (10) and equation (11), the coefficient H of the FWHM and the coefficient E of E95 of the laser beam to be measured may be obtained by a method such as a least squares or a multiple linear regression. Specifically, the coefficient H of the FWHM and the coefficient E of E95 in the above equation (10) and equation (11) are brought into equation (8) and equation (9), so that the FWHM and E95 of the laser beam may be calculated in real time. The FWHM and E95 may be fed back to the laser device, a closed-loop feedback of the FWHM and E95 may be achieved by controlling a discharge delay time.

According to another aspect of the present disclosure, there is provided a laser device. As shown in FIG. 3, the laser device includes: the above device 4 for measuring a spectrum for a laser device, a discharge device 1, a power supply device 2, and a line width narrowing device 3. The discharge device 1 includes a discharge cavity, and an inside of the discharge cavity contains fluorine gas (F2) or inert gas (such as argon gas Ar or krypton gas Kr). The discharge device 1 is configured to generate a laser beam, such as a laser beam having a central wavelength of 193 nm or 248 nm, incident on the device for measuring a spectrum for a laser device after being pumped with a high voltage by the power supply device 2. The power supply device 2 includes a high voltage power supply and is configured to pump the discharge cavity of the discharge device 1 with a high voltage so that the discharge device 1 generates a laser beam. The line width narrowing device 3 includes a line width narrowing module and is configured to generate a laser beam having an extremely narrow FWHM, and adjust a central wavelength and an output stability of the laser beam. The device 4 for measuring a spectrum for a laser device is configured to monitor spectral parameters of the laser beam emitted by the discharge device 1 in real time and give a feedback to the line width narrowing device.

Specifically, the laser device may be provided with an online feedback control device, including a storage module and a control module. The storage module is configured to store the spectral parameters of the laser measured by the device 4 for measuring a spectrum for a laser device, such as an energy of the laser beam, a central wavelength, a FWHM, and E95. The control module may feedback the above spectral parameters to the line width narrowing device 3 according to a comparison of a storage data of the above storage module with reference parameters, so as to control the laser device for an output with a stable laser beam, thereby achieving a state monitoring and a closed-loop control to the laser device.

The device 4 for measuring a spectrum for a laser device may be specifically embodied based on the above disclosure, which will not be repeated here. In addition, the laser device of the present disclosure may be a high repetition frequency excimer laser.

Therefore, based on the device for measuring a spectrum for a laser device of the present disclosure, in the method for measuring a spectrum for a laser device, it is only necessary to process a center and a peak value of an interference fringe to directly obtain a central wavelength, a FWHM and E95 of a laser beam to be measured. As the optical path design structure of the method for measuring a spectrum for a laser device is simple, the measurement calculation method is simple and practical, and the measurement precision is extremely high, it has a great scientific research and commercial value.

The specific embodiments described above further describe the objectives, technical solutions and beneficial effects of the present disclosure in detail. It should be understood that the above are only specific embodiments of the present disclosure, and are not intended to limit the present disclosure. Any modification, equivalent replacement, improvement, etc. made within the spirit and principle of the present disclosure should be included within the protection scope of the present disclosure.

What is claimed is:

1. A device for measuring a spectrum for a laser device, comprising:
    a first optical path assembly configured to homogenize a laser beam emitted by the laser device, and
    a second optical path assembly constituting a measurement optical path with the first optical path assembly, and configured to perform a dispersion imaging on the laser beam homogenized by the first optical path assembly, wherein the second optical path assembly comprises:

an FP (Fabry-Perot) etalon, the homogenized laser beam passing through the FP etalon to generate an interference fringe; and a grating, configured to disperse the laser beam passing through the FP etalon, wherein the grating and the FP etalon are connected in series, and wherein the grating is arranged after the FP etalon, or is arranged before the FP etalon in the measurement optical path;

wherein the second optical path assembly comprises: a diffusing sheet, a field diaphragm and a collimating lens arranged in sequence along the measurement optical path, wherein, the diffusing sheet is configured to diffuse the laser beam homogenized by the first optical path assembly;

the field diaphragm is configured to control an imaging range of the laser beam diffused by the diffusing sheet in a dispersion imaging process, wherein the field diaphragm and the collimating lens are connected in sequence along the measurement optical path; and the collimating lens is arranged before the FP etalon in the measurement optical path, and is configured to ensure a collimation characteristic of the laser beam incident on the FP etalon, wherein the first optical path assembly comprises: a first beam splitter, a second beam splitter and a light homogenizing assembly arranged in sequence along the measurement optical path, wherein the light homogenizing assembly comprises: an optical light homogenizing element, a first convergent lens and a first reflecting mirror arranged in sequence along the measurement optical path, the optical light homogenizing element, the first convergent lens and the first reflecting mirror are connected in series, the optical light homogenizing element is arranged before the first convergent lens, and the first convergent lens is arranged before the first reflecting mirror; wherein, the light homogenizing element is configured to homogenize the laser beam, so as to eliminate an influence of the laser beam on a measurement of a spectrum for a laser device, and the light homogenizing element is a microlens array or an integrator rod;

the first convergent lens is configured to converge the laser beam homogenized by the light homogenizing element to the first reflecting mirror; and the first reflecting mirror is configured to reflect the laser beam converged by the first convergent lens to a light facing surface of the diffusing sheet, and a light facing surface of the first reflecting mirror is coated with a high reflection film.

2. The device according to claim 1, wherein, the first beam splitter is configured to reflect a portion of the laser beam emitted by the laser device to the second beam splitter;

the second beam splitter is configured to enable the portion of the laser beam reflected by the first beam splitter to be incident on the light homogenizing assembly; and the light homogenizing assembly is configured to homogenize the laser beam incident through the second beam splitter.

3. The device according to claim 2, wherein the device for measuring the spectrum for the laser device further comprises:

an energy measurement assembly correspondingly arranged in an optical path to which another portion of the laser beam is reflected by the second beam splitter, and configured to measure an energy of the laser beam of the laser device in real time.

4. The device according to claim 1, wherein the second optical path assembly further comprises: a second reflecting mirror, a second convergent lens and an imaging apparatus arranged in sequence along the measurement optical path, wherein, the second reflecting mirror is arranged after the grating in the measurement optical path, and configured to reflect the laser beam dispersed by the grating to the second convergent lens;

the second convergent lens is configured to converge the laser beam reflected by the second reflecting mirror to the imaging apparatus; and the imaging apparatus is configured to image the laser beam passing through the second convergent lens.

5. The device according to claim 1, wherein the grating is an echelle grating, and a blaze angle of the echelle grating is $\alpha$, $\alpha \geq 70$ degrees.

6. A method for measuring the spectrum for the laser device, applied in the device for measuring the spectrum for the laser device according to claim 1, so as to measure spectral parameters of the laser beam generated by the laser device.

7. The method according to claim 6, comprising:

obtaining a central wavelength $\lambda$ of the laser beam emitted by the laser to be:

$$\lambda = \lambda_f + k \cdot FSR, \text{ and } |\lambda - \lambda_g| \leq FSR/2$$

wherein $\lambda_g$ is a first central wavelength of the laser beam obtained based on the grating of the device for measuring the spectrum for the laser device, and $\lambda_f$ is a second central wavelength of the laser beam obtained based on the FP etalon of the device for measuring the spectrum for the laser device, k is an integer, FSR is a free spectral range of the FP etalon;

obtaining, based on the central wavelength $\lambda$ of the laser beam and a radius r and a width $d_r$ of the interference fringe obtained by the FP etalon, a spectral width $\Delta\lambda$ of the laser beam to be:

$$\Delta\lambda = \frac{\lambda \cdot r}{f^2} d_r$$

wherein f is a focal length of a second convergent lens of the device for measuring the spectrum for the laser device; and obtaining a spectral FWHM (full width at half maxima) and E95 of the spectral parameters according to the spectral width $\Delta\lambda$ of the laser beam.

8. The method according to claim 7, wherein the obtaining the spectral FWHM and E95 of the spectral parameters according to the spectral width $\Delta\lambda$ of the laser beam comprises:

$$FWHM = [\Delta\lambda_1 \Delta\lambda_2 \ldots \Delta\lambda_p 1] \cdot [h_1 h_2 \ldots h_p h_{p+1}]^T;$$

$$E95 = [\Delta\lambda_1 \Delta\lambda_2 \ldots \Delta\lambda_p 1] \cdot [e_1 e_2 \ldots e_p e_{p+1}]^T$$

wherein $d_{r1}$, $d_{r2}$, $d_{r3}$, $d_{r4}$, ... $d_{rp}$ are width values of different interference fringes at different heights for the FP etalon; $\Delta\lambda_1$, $\Delta\lambda_2$, $\Delta\lambda_3$, $\Delta\lambda_4$, ... $\Delta\lambda_p$ are different spectral widths of the spectrum for the laser device corresponding to the $d_{r1}$, $d_{r2}$, $d_{r3}$, $d_{r4}$, ... $d_{rp}$; H=[h$_1$ $h_2 \ldots h_p\ h_{p+1}]^T$ is a coefficient of the FWHM of the laser beam; and $E=[e_1\ e_2 \ldots e_p\ e_{p+1}]^T$ is a coefficient of E95 of the laser beam.

\* \* \* \* \*